United States Patent
Shim et al.

(10) Patent No.: US 9,748,318 B2
(45) Date of Patent: Aug. 29, 2017

(54) AUXILIARY LINES REDUCING RESISTANCE IN A CATHODE OF AN ORGANIC LIGHT EMITTING DISPLAY DEVICE

(71) Applicant: LG Display Co., Ltd., Seoul (KR)

(72) Inventors: Sungbin Shim, Yangsan-si (KR); Suhyeon Kim, Paju-si (KR); MoonBae Gee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/859,783

(22) Filed: Sep. 21, 2015

(65) Prior Publication Data

US 2016/0293888 A1    Oct. 6, 2016

(30) Foreign Application Priority Data

Apr. 2, 2015    (KR) .................. 10-2015-0046695

(51) Int. Cl.
*H01L 27/32*    (2006.01)
*H01L 51/52*    (2006.01)

(52) U.S. Cl.
CPC ...... *H01L 27/3246* (2013.01); *H01L 27/3258* (2013.01); *H01L 51/5228* (2013.01); *H01L 27/3248* (2013.01)

(58) Field of Classification Search
CPC . H01L 27/32; H01L 27/3246; H01L 27/3258; H01L 27/3248; H01L 27/14636
See application file for complete search history.

(56) References Cited

U.S. PATENT DOCUMENTS

| | | | |
|---|---|---|---|
| 2006/0113900 A1* | 6/2006 | Oh | H01L 27/3276 313/504 |
| 2014/0158995 A1* | 6/2014 | Park | H01L 27/3262 257/40 |
| 2015/0008398 A1* | 1/2015 | Lee | H01L 51/5212 257/40 |

* cited by examiner

*Primary Examiner* — Phuc Dang
(74) *Attorney, Agent, or Firm* — Fenwick & West LLP

(57) ABSTRACT

An organic light emitting diode (OLED) display device is described that includes a shared cathode between OLED pixels as well as auxiliary lines that are formed between rows and/or columns of the OLED pixels. As the cathode is shared between many if not all of the pixels of display device, resistance within the cathode can affect the brightness of those pixels that are further from the cathode's voltage source. The auxiliary lines serve to counteract the voltage drop caused by this resistance. The auxiliary lines are electrically connected to the cathode in close proximity to individual pixels of the display.

24 Claims, 20 Drawing Sheets

AUXILIARY LINES REDUCING RESISTANCE IN A CATHODE OF AN ORGANIC LIGHT EMITTING DISPLAY DEVICE

CROSS-REFERENCE TO RELATED APPLICATION

This application claims priority from and the benefit under 35 U.S.C. §119(a) of Korean Patent Application No. 10-2015-0046695, filed on Apr. 2, 2015, which is hereby incorporated by reference for all purposes as if fully set forth herein.

BACKGROUND OF THE INVENTION

1. Field of the Invention

The present invention relates to an organic light emitting display device in which auxiliary lines are disposed around pixel areas, and a method of fabricating the same.

2. Description of the Prior Art

With the development of an information-oriented society, the demands for various display devices for displaying images are increasing. Recently, various display devices, such as an LCD (Liquid Crystal Display), a PDP (Plasma Display Panel), an OLED (Organic Light Emitting Display Device), or an organic electro-luminescence display device, have been utilized. The various display devices include display panels corresponding thereto.

In the display panel, a thin film transistor is formed in each pixel area, and a specific pixel area is controlled though the current flow of the thin film transistor. The thin film transistor is comprised of a gate and a source/drain electrode.

The organic light emitting display includes a light-emitting layer that is formed between two different electrodes. When an electron created by one electrode and a hole created by the other electrode are injected into the light-emitting layer, the injected electron and the hole combine with each other to create an exciton. Then, the created exciton emits light while it transitions from the excited state to the ground state to thereby display images.

Meanwhile, in the organic light emitting display, the electrode, e.g., a cathode, which injects the electron, may exhibit a voltage drop due to the resistance of the cathode. As the size of the display device increases, the voltage drop may increase and this may cause the degradation of the brightness. Accordingly, an auxiliary line (or an auxiliary electrode) is formed in order to reduce or eliminate the voltage drop.

SUMMARY OF THE INVENTION

A display device and method for its manufacture is described where an auxiliary line can be formed to contact the cathode of pixels of the display. The auxiliary line is formed within a contact hole having an inverse tapered shape, thereby removing the need for additional layers and process steps during manufacturing to electrically connect the auxiliary line to the cathode. In one embodiment, the display device includes a pixel area and a contact area. Within the pixel area, an anode is electrically coupled to a source or a drain of a thin film transistor through a pacification layer. An organic light-emitting layer is formed on the anode, and the cathode is formed on the organic light-emitting layer. Within the contact area, an auxiliary contact hole is formed in the pacification layer, the auxiliary contact hole formed to have an inverse tapered shape. An auxiliary line has a first portion formed over the pacification layer and a second portion formed in the auxiliary contact hole. A portion of the cathode physically contacts the second portion of the auxiliary line within the auxiliary contact hole.

It is to be understood that both the foregoing general description and the following detailed description of the present invention are exemplary and explanatory and are intended to provide further explanation of the invention as claimed.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

BRIEF DESCRIPTION OF THE DRAWINGS

Additional The above and other objects, features and advantages of the present invention will be more apparent from the following detailed description taken in conjunction with the accompanying drawings, in which.

DETAILED DESCRIPTION OF THE EXEMPLARY EMBODIMENTS

Figure 1:
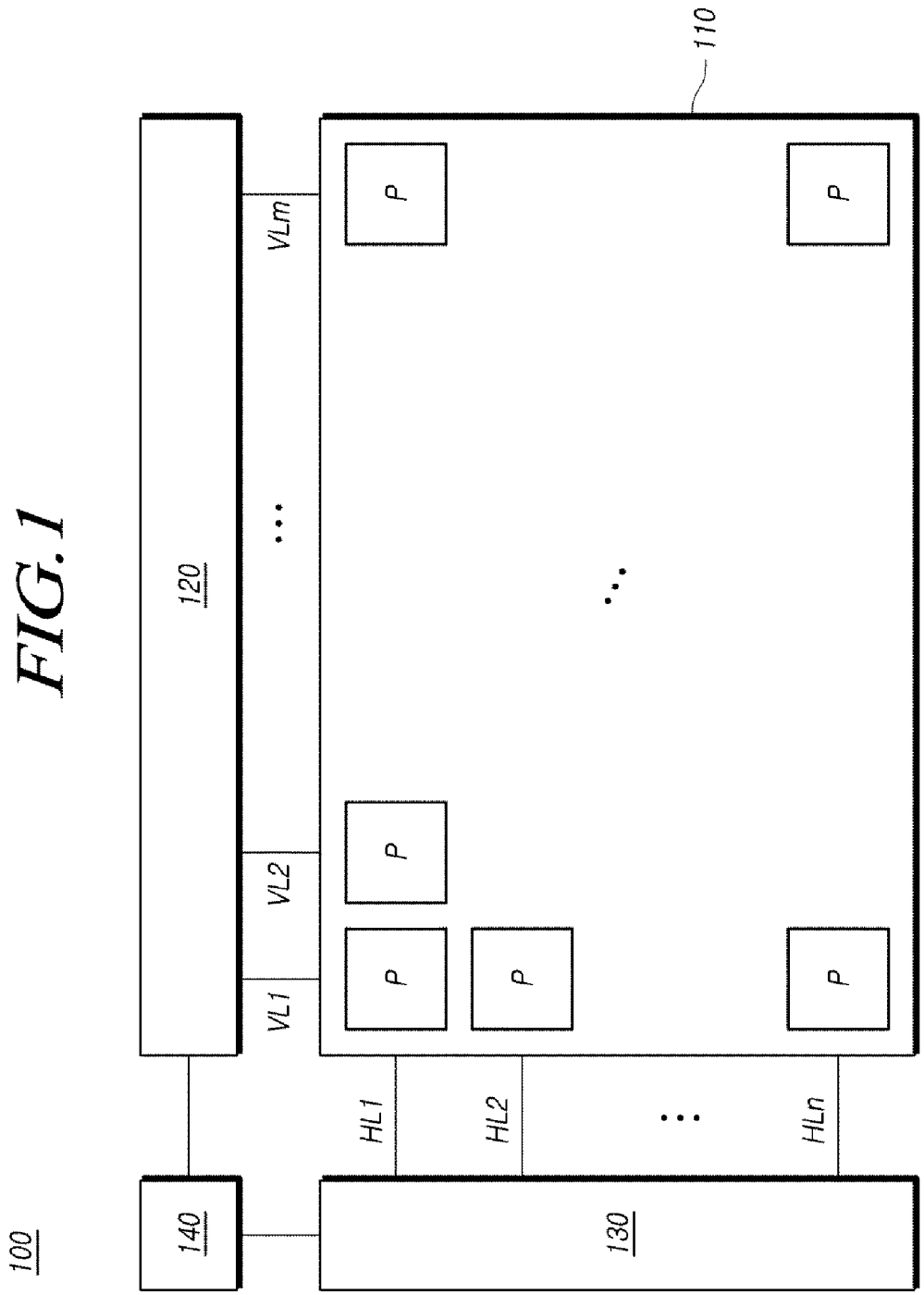
FIG. 1 schematically illustrates a display device according to the embodiments.

Hereinafter, exemplary embodiments of the present invention will be described with reference to the accompanying drawings. In designating elements of the drawings by reference numerals, the same elements will be designated by the same reference numerals although they are shown in different drawings. Further, in the following description of the present invention, a detailed description of known functions and configurations incorporated herein will be omitted when it may make the subject matter of the present invention rather unclear.

In addition, terms, such as first, second, A, B, (a), (b) or the like may be used herein when describing components of the present invention. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 schematically illustrates a display device according to the embodiments.

Referring to FIG. 1, the display device 100, according to the embodiments, includes: a display panel 110 that has a plurality of the first lines VL1 to VLm formed in the first direction (e.g., the vertical direction) thereon, and a plurality of the second lines HL1 to HLn formed in the second direction (e.g., the horizontal direction) thereon; the first driving unit 120 that supplies the first signal to the plurality of the first lines VL1 to VLm; the second driving unit 130 that supplies the second signal to the plurality of the second lines HL1 to HLn; and a timing controller 140 that controls the first driving unit 120 and the second driving unit 130.

In the display panel 110, a plurality of pixels (P) is defined by the intersections of the plurality of the first lines VL1 to VLm formed in the first direction (e.g., the vertical direction) and the plurality of the second lines HL1 to HLn formed in the second direction (e.g., the horizontal direction).

The first driving unit 120 and the second driving unit 130 may include at least one driver IC that outputs signals for displaying images.

The plurality of the first lines VL1 to VLm formed in the first direction on the display panel 110, for example, may be data lines that are formed in the vertical direction (the first direction) to transfer a data voltage (the first signal) to the vertical pixel lines, and the first driving unit 120 may be a data driving unit for supplying the data voltage to the data lines.

In addition, the plurality of the second lines HL1 to HLm formed in the second direction on the display panel 110, for example, may be gate lines that are formed in the horizontal direction (the second direction) to transfer a scan signal (the second signal) to the horizontal pixel lines, and the second driving unit 130 may be a gate driving unit for supplying the scan signal to the gate lines.

In addition, the display panel 110 includes a pad portion connected with the first driving unit 120 and the second driving unit 130. When the first driving unit 120 supplies the first signal to the plurality of the first lines VL1 to VLm, the pad portion transfers the same to the display panel 110, and likewise, when the second driving unit 130 supplies the second signal to the plurality of the second lines HL1 to HLn, the pad portion transfers the same to the display panel 110.

The pixel includes one or more sub-pixels. The sub-pixel may have a color filter of a specific color formed therein, or the sub-pixel may refer to the unit in which the organic light emitting diode can emit a light of a particular color without the color filter. The colors defined in the sub-pixel may include red (R), green (G), blue (B), and selectively white (W), but the present invention is not limited thereto. The sub-pixel includes a separate thin film transistor and electrodes connected thereto, so hereinafter, the sub-pixel constituting the pixel will be regarded as a pixel area as well.

The organic light emitting display device may be implemented in a top-emission type, a bottom-emission type, or a dual-emission type. Even with any emission type, the large-scale display panel may exhibit a voltage drop of the cathode in the course of forming the cathode in the front, so an auxiliary electrode or an auxiliary line may be formed in the non-aperture area in order to reduce or eliminate the voltage drop. Hereinafter, the description will be made of the display device in the top-emission type in the present specification, but the embodiments of the present invention are not limited thereto, and the present invention may be applied to all of the display devices that can prevent a voltage drop of the cathode.

Figure 2:
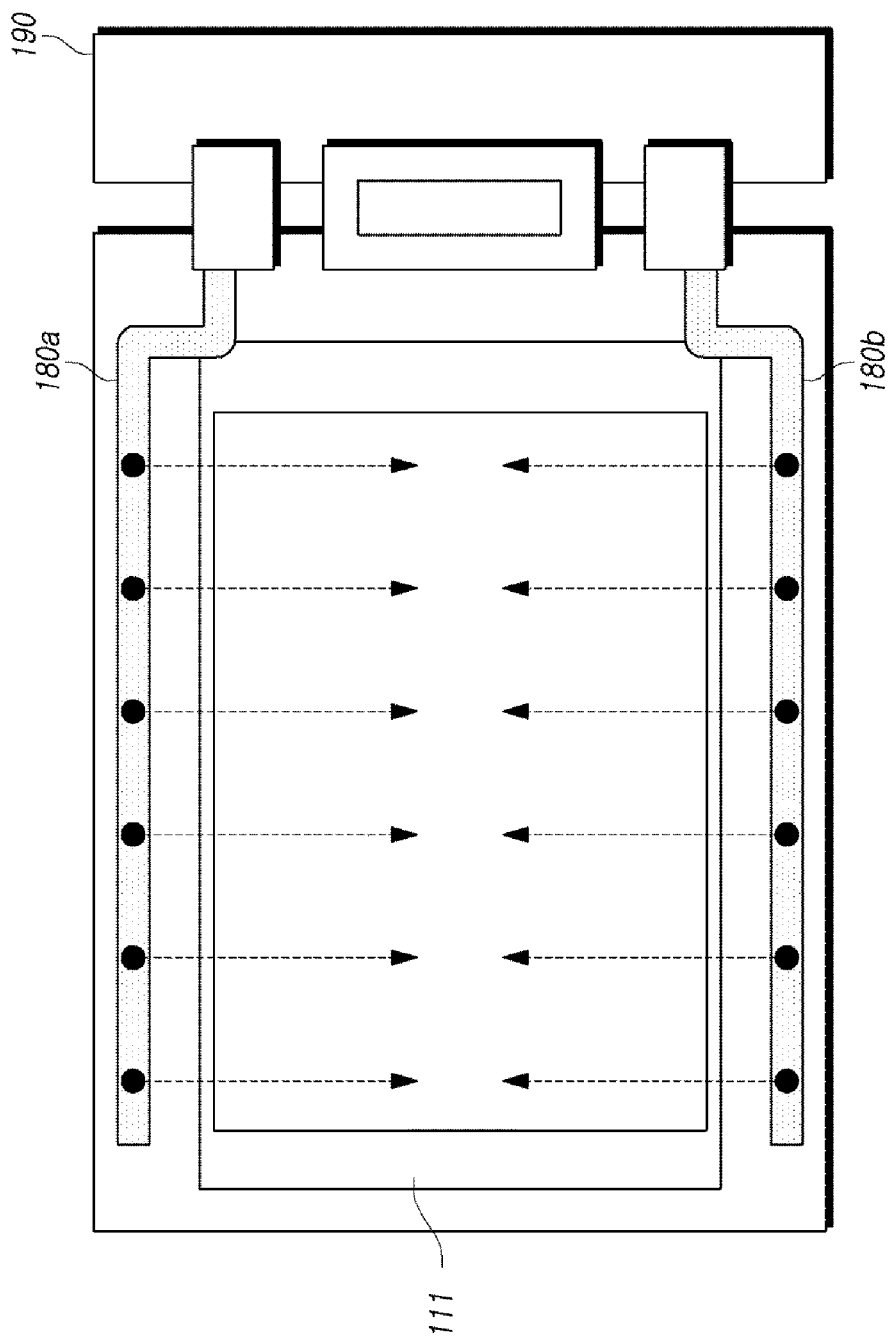
FIG. 2 illustrates a structure in which the voltage drop occurs.

FIG. 2 illustrates a structure in which the voltage drop occurs. With regard to the structure that applies power to the display panel, the power source 190 applies the base power, such as the reference numerals 180a and 180b, to the display area 111 of the display panel through the first driving unit 120 and the second driving unit 130. Since the base power is applied from the upper and lower edges, the brightness is highest in the edges of the display area 111, and lowest in the center thereof. This feature will be described in detail in FIG. 3.

Figure 3:
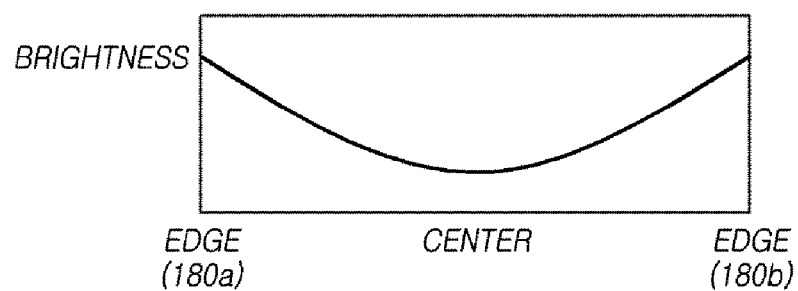
FIG. 3 is a graph showing the degradation of the brightness due to the voltage drop in the case of not adopting an auxiliary electrode.

FIG. 3 is a graph showing the degradation of the brightness due to a voltage drop in the case of not adopting an auxiliary electrode. Referring to FIG. 3, the brightness is high in the edges where the base power is supplied as the reference numerals 180a and 180b of FIG. 2, but is low in the center thereof. As the size of the display device increases, such a phenomenon may be more severe. The auxiliary electrode would prevent this voltage drop and degradation of the brightness.

The typical organic light emitting display device in the top-emission type adopts a thin film cathode (~100 Å), so the non-uniformity in the brightness may be caused by the high resistance of the cathode. In addition, since a white EL is deposited on the front surface of the panel array, it is not easy to apply the auxiliary electrode or the auxiliary line. One of the methods to cope with the limit above introduces a partition structure to make the cathode come into contact with the auxiliary electrode through the IZO deposition in such a way that the auxiliary electrode is exposed, even though the white EL is deposited on the panel array, to thereby improve the uniformity of the brightness.

Figure 4:
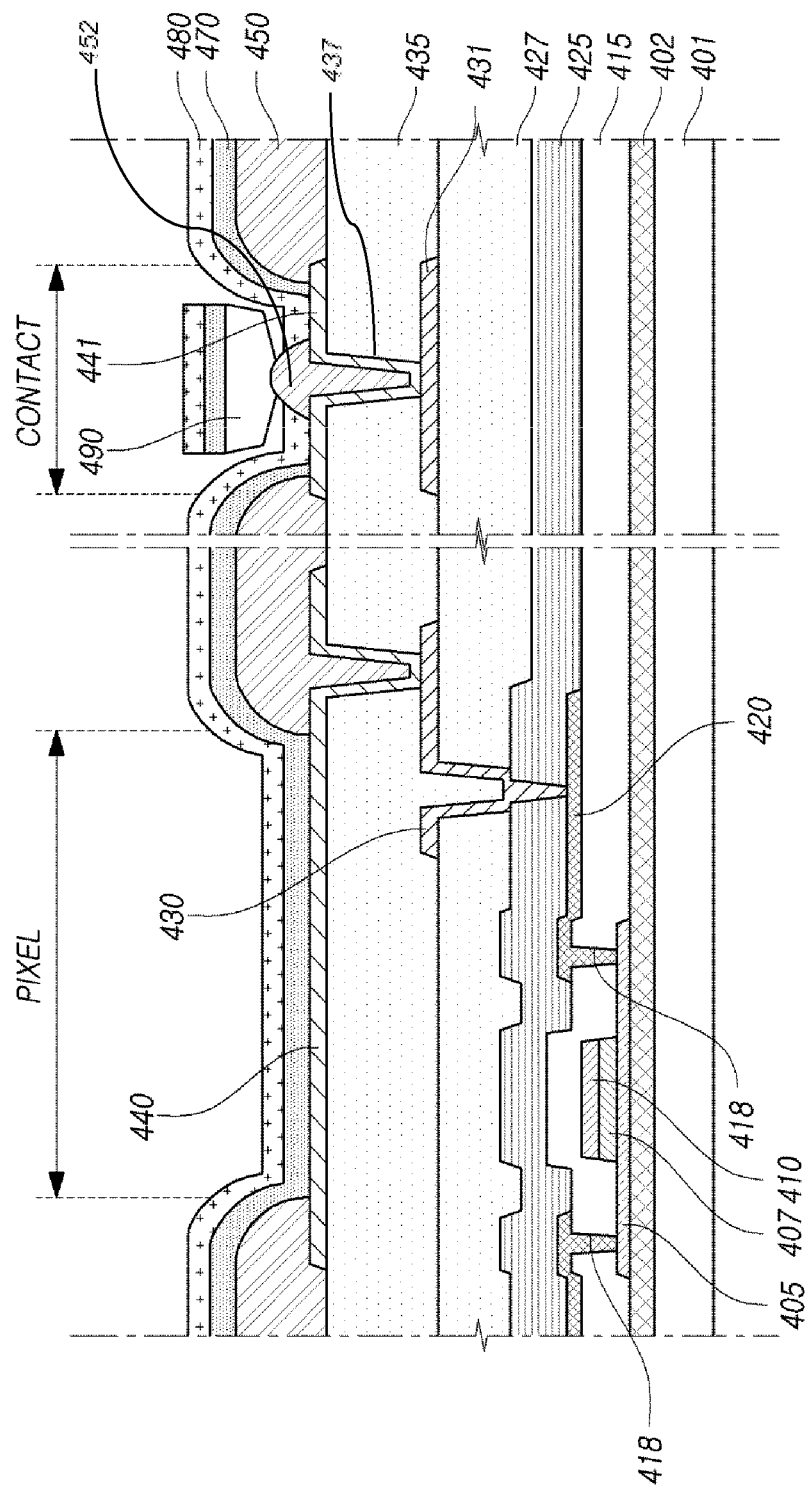
FIG. 4 illustrates a configuration for forming an auxiliary electrode by a partition.

FIG. 4 illustrates a configuration for forming an auxiliary electrode by a partition. A buffer 401 is positioned on a substrate 401, and an active layer 405 on the buffer, a gate insulator 407, a gate 410, an interlayer dialect 415, a source or a drain 420, a passivation layer 425, the first pacification layer 427, a second pacification layer 435, a connection electrode 430 connected to the source or the drain 420, the first auxiliary electrode 431 formed of the same material as the connection electrode 430, and the first electrode or, for example, an anode 440 are formed, wherein the source or the drain 420 is connected with the active layer 405 through a contact hole 418 that is formed in the interlayer dialect 415. In addition, the second auxiliary electrode 441 formed of the same material as the anode 440, a bank 450, an organic light-emitting layer 470, the second electrode or, for example, a cathode 480, and a partition 490 are positioned thereon. The first auxiliary line 431 may be the same thickness as the connection electrode 430, or the first auxiliary line may be thicker than the connection electrode 430.

"Pixel" denotes a pixel area, and "Contact" refers to a contact area where the auxiliary electrode and the cathode as the second electrode are connected with each other.

When the partition structure of FIG. 4 is applied, the uniformity of the brightness can be enhanced, but three layers (430, 435, and 490) are to be added in order to form the auxiliary electrode and the partition. That is, a thick auxiliary electrode is used for the purpose of reducing the resistance, in connection with the cathode, and the pacification layer is added in order to flatten the same. In addition, a non-deposition area of the white EL, which is deposited on the front surface in an area where the white EL is not formed due to the partition (not separately labelled in FIG. 4), is formed to thereby form the structure by which the auxiliary electrode comes into contact with the cathode.

Three layers are used to implement the auxiliary electrode using the partition structure of FIG. 4, and to this end, a process of the auxiliary electrode 441 (deposition→exposure→development→etching), a process of the bank layer 450 (coating→exposure→development→heat treatment), and a process of the partition 490 (coating→exposure→development→heat treatment) are added.

In the implementation illustrated in FIG. 4, the partition 490 is formed on an island of bank material 452 formed on a portion the second auxiliary line 441. In one embodiment, the island of bank material fills the remainder of the auxiliary contact hole 437 that the second auxiliary line is formed in in order to contact the first auxiliary line 431. The island of bank material protrudes sufficiently far from the second auxiliary line 441 and cathode 480 to allow the partition 490 to be formed without physically contacting the portion of the cathode 480 physically contacting the second auxiliary line.

Hereinafter, in the present specification, the configuration for connecting the auxiliary electrode or the auxiliary line with the cathode without the partition is discussed. To this end, the embodiments of the present invention may use a difference in step coverage between a metal and an organic material so that the organic light-emitting layer is not deposited in some areas of the auxiliary line.

Although the buffer layer, the pacification layer (or pacification film), and the passivation layer may be referred to as different names, hereinafter, they will be referred to as a protective layer altogether. The protective layer may be interposed between the source/drain and the gate, the gate and the active layer, the anode and the source/drain, or the anode and the cathode, and may be formed of an organic material or an inorganic material, but the protective layer is not limited thereto in the present invention.

In the present invention, the auxiliary line that comes into contact with the cathode is positioned between the pixel areas, and the auxiliary line is formed of the same material as the anode, the source/drain, or a connection electrode M3 for electrically connecting the same, so the process of forming the auxiliary line may be performed without an additional mask. In the present specification, the auxiliary electrode and the auxiliary line will be used interchangeably. In addition, during the process of connecting the auxiliary line with the cathode by way of increasing the distance of the auxiliary electrode/auxiliary line and the organic light-emitting layer, the auxiliary line and the cathode are connected with each other due to a difference of step coverage between the organic light-emitting layer and the cathode material, whereas the organic light-emitting layer cannot permeate between the auxiliary line and the cathode so that the contact portion of the auxiliary line and the cathode can increase.

Hereinafter, the present invention is applied to a structure that includes a substrate on which a plurality of pixel areas is defined, the first electrode positioned on each of the pixel areas, and an organic light-emitting layer and the second electrode, which are positioned on the plurality of the first electrodes. The description will be made of the organic light emitting display device, in which the first auxiliary lines, which are positioned in at least one of the first direction or the second direction between two or more pixel areas, come into contact with the second electrode in the protective layer in which the first electrode is positioned. More specifically, a first contact hole (also referred to as an auxiliary contact hole 590) is positioned in the protective layer in order for the second electrode to come into contact with the first auxiliary line. The first auxiliary line is positioned between the pixel areas, and since the first auxiliary line is formed of the same material as the first electrode, e.g., the anode, in the same process, the number of processes may be reduced. In addition, a separate layer is not required to form the first auxiliary line, so a thin film display panel can be attained. Furthermore, since the second electrodes, e.g., the cathodes are uniformly provided in the display panel due to the first auxiliary lines, the brightness of the display panel can be uniform to thereby enhance the visual sensibility.

In an embodiment of the present invention, the second auxiliary line may be formed under the first auxiliary line. Although various embodiments of forming the second auxiliary line are disclosed in FIG. 5 and FIG. 6, the present invention is not limited thereto. That is, an embodiment of the present invention may be implemented by eliminating the second auxiliary line 520 or 620 of FIG. 5 or FIG. 6, or another embodiment of the present invention may be implemented by adopting the second auxiliary line 520 or 620 of FIG. 5 or FIG. 6. That is, the second auxiliary line 520 or 620 may be selectively included.

Figure 5:
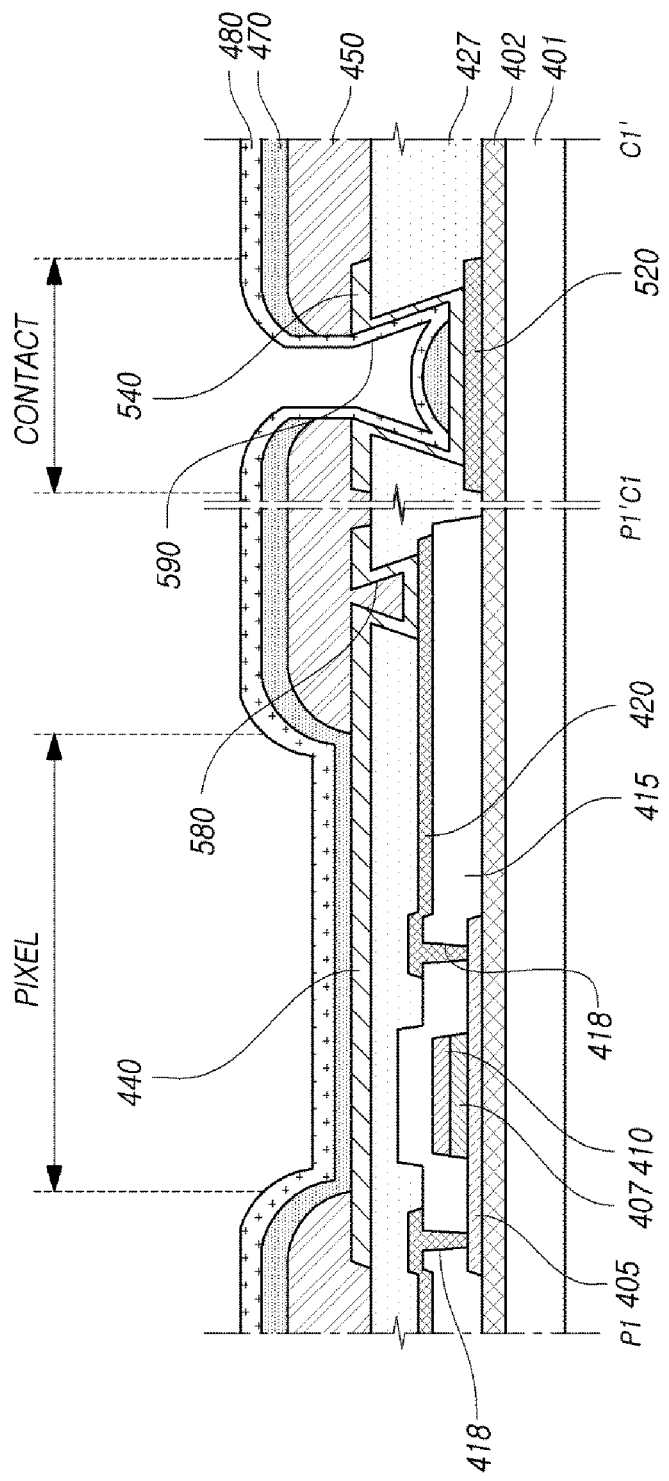
FIG. 5 illustrates a stack structure of a display panel that has a single pacification layer according to an embodiment of the present invention.

FIG. 5 illustrates a stack structure of a display panel that has a single pacification layer according to an embodiment of the present invention.

In FIG. 5, the first auxiliary line 540 is formed of the same material as the anode/reflector 440. The second auxiliary line 520 is formed of the same material as the source/drain 420. The contact hole 580, through which the anode 440 and the source/drain 420 come into contact with each other, is provided. The first pacification layer 427, which is an example of the protective layer, is formed using negative photoresist together with the contact hole 590 as the partition structure. The low-resistance cathode is implemented through the contact between the cathode 480 and the first auxiliary line 540. It is due to that fact that the organic material of the organic light-emitting layer 470 travels straight in the process of deposition, the organic material is not deposited on the wall in the contact hole 590 in a step form or an inversely tapered form. Meanwhile, the metal has good step coverage due to the irregular directivity in the deposition, so the metal can be deposited on the wall of the contact hole 590 in the inversely tapered form. Consequently, only the low-resistance cathode comes into contact with the auxiliary electrode 540 on the wall of the contact hole 540.

The pacification layer is different in its thickness because the interlayer dialect 415 is formed under the source/drain 420 in the pixel area, whereas the interlayer dialect 415 is not formed under the second auxiliary line 520. According to this, as the thickness of the negative photoresist in the inversely tapered form increases, the non-permeated area of the organic material (EL) becomes wide, so that the cathode more easily comes into contact with the auxiliary line. That is, the permeation of the organic material may be prevented by the step that is as high as the bank 450 and the pacification layer 427.

Comparing the configuration of FIG. 5 with the configuration of FIG. 4, since the connection electrode 430, the second pacification layer 435, and the layers related to the partition 490 of FIG. 4 are eliminated, the exposure process may be reduced three times, and the efficiency of the process can be enhanced by removing three layers. In particular, in the case of application to the top-emission type, the number of processes thereof may be the same as that of the bottom-emission type, so the cost may be considerably reduced. In addition, the present embodiment enables the thin film display panel, and reduces or eliminates the voltage drop of the cathode by forming the auxiliary line in the contact area that is the non-aperture area between the pixel areas to thereby secure the uniform brightness. In addition, the passivation layer 425 of FIG. 4 has been removed in the configuration of FIG. 5 as well. The passivation layer 425 may be selectively included for the step coverage.

Referring to the configuration of FIG. 5, the contact hole 590, in which the first auxiliary line 540 is formed is deeper than the contact hole 580, to which the anode 440 is connected. Both contact holes 580 and 590 (as well as contact holes 680 and 690, described below with respect to FIG. 6) are formed to have an inverted "V" structure, such that the bottom of the contact hole is wider than the top of the contact hole, and the sidewalls slope in an angled manner from bottom to top. As a result of this construction, organic material does not permeate into the contact hole 590 in the course of depositing the the light emitting layer 470. In contrast, due to the angled formation of the electrically conductive layers (lines/electrodes) of the device, an electrical contact area is formed between these any two electrically conductive layers on the sidewalls of the contact holes. For the cathode and first auxiliary lines in FIGS. 5 and 6 particularly, this electrical contact is how power is transferred from the auxiliary lines to the cathode, thereby reducing the resistance in the cathode itself regardless of where the pixel is located in the display.

Figure 6:
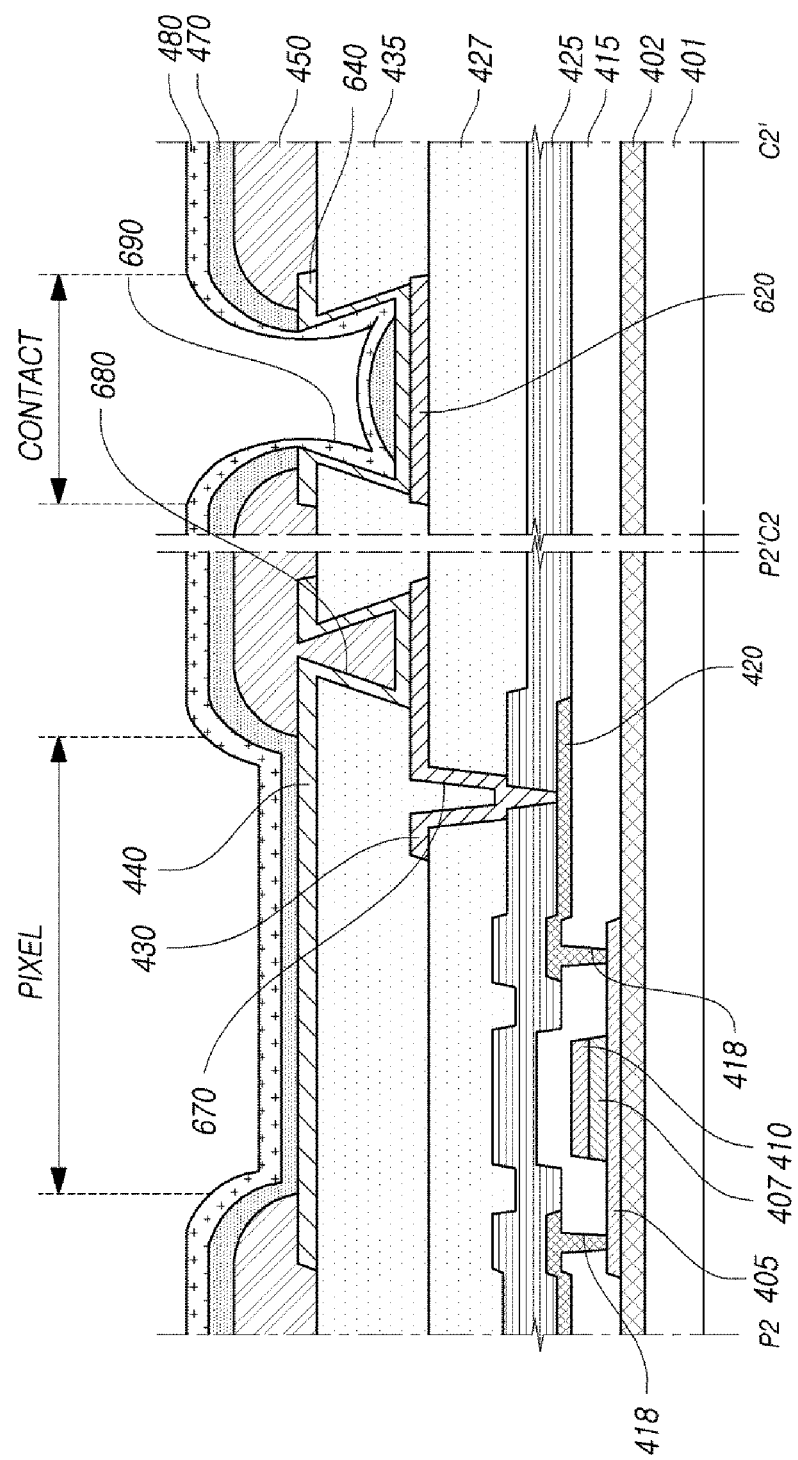
FIG. 6 illustrates a stack structure of a display panel that has two pacification layers according to another embodiment of the present invention.

FIG. 6 illustrates a stack structure of a display panel that has two single pacification layers according to another embodiment of the present invention. According to the structure of FIG. 6, the second auxiliary line 620, which is formed of the same material as the connection electrode 430 that makes the source or the drain 420 come into contact with the anode 440 in the structure of FIG. 4, may increase in the thickness. As a result, the resistance of the cathode 480 may be lowered due to the increase in the thickness of the second auxiliary line 620.

In other words, the second auxiliary line 620 is formed independently from the source/drain 420, so the second auxiliary line 620 may be thickly deposited in the process. Consequently, the resistance of the cathode 480 may be reduced by increasing the thickness of the second auxiliary line 620.

Furthermore, since the second auxiliary line 620 is formed in a different layer from the source/drain 420, it may be connected vertically so as not to overlap the gate. That is, the second auxiliary line 620 may be formed in the form of a mesh to overlap the first auxiliary line 640 in the vertical direction. This will be described later with reference to FIG. 16.

That is, comparing FIG. 6 with FIG. 4, one layer is eliminated by removing the partition 490 to thereby simplify the process. In addition, when the thickness of the second auxiliary line 620, which is formed in the non-aperture contact area, is increased, the line resistance may be lowered. As the embodiment of the present invention, the negative PR may be used as the pacification layer. Here, the difference from the embodiment of FIG. 5 is that a thicker line can be applied using the auxiliary line to thereby secure a high aperture-ratio. That is, the embodiment of FIG. 6 may be applied to the case where a low resistance of the line is not easily obtained, compared to the embodiment of FIG. 5. In the case of the thick auxiliary line, the aperture-ratio of the panel may increase.

Similarly to FIG. 4, the implementation may include an island of bank material 452 that is formed on the first auxiliary line near the bottom of contact hole 590. The island of bank material is covered by the portion of the cathode 480 formed in the contact hole 590.

The active layer 405 of FIG. 5 and FIG. 6 may be formed of an oxide semiconductor or low-temperature poly-silicon (LIPS). The source/drain 420, the gate 410, the connection electrode 430, and the second auxiliary line 520 or 620 are formed of conductive materials. For example, they may be formed of an alloy of Cu/MoTi or Mo/Al/Mo, but they are not limited thereto, while various materials may be applied thereto. The anode/reflector 440 and the first auxiliary line 540 or 640 may be formed of ITO or ITO/Ag/ITO. The bank 450 may be formed using OC (overcoat), and the cathode may be formed using IZO or MgAg.

Since the first auxiliary line 540 or 640 in FIG. 5 and FIG. 6 is formed of the same material as the anode 440, i.e., the first electrode, in the same process, the number of masks can be reduced and the process can be simplified.

In FIG. 5 and FIG. 6, the first auxiliary line 540 or 640 is connected with the second auxiliary line 520 or 620 through the contact hole 590 or 690, and the cathode with a low resistance can be implemented by increasing the thickness of the auxiliary line connected with the cathode. In addition, in the case where the auxiliary lines are configured to overlap each other in the form of a mesh, the auxiliary lines are applied with the base power similar to the cathode so that the base power is uniformly applied to the central area of the display panel as well as the edges of the display panel, to thereby improve the uniformity of the brightness in the display panel.

Figure 7:
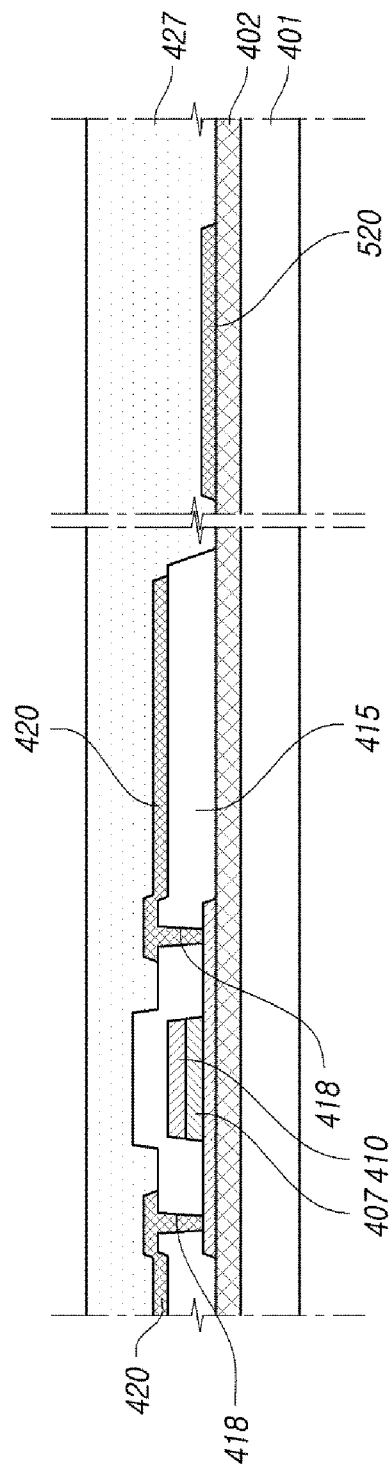
FIGS. 7 to 9 are sectional views illustrating the process of forming the panel structure of FIG. 5 according to an embodiment of the present invention.
Figure 8:
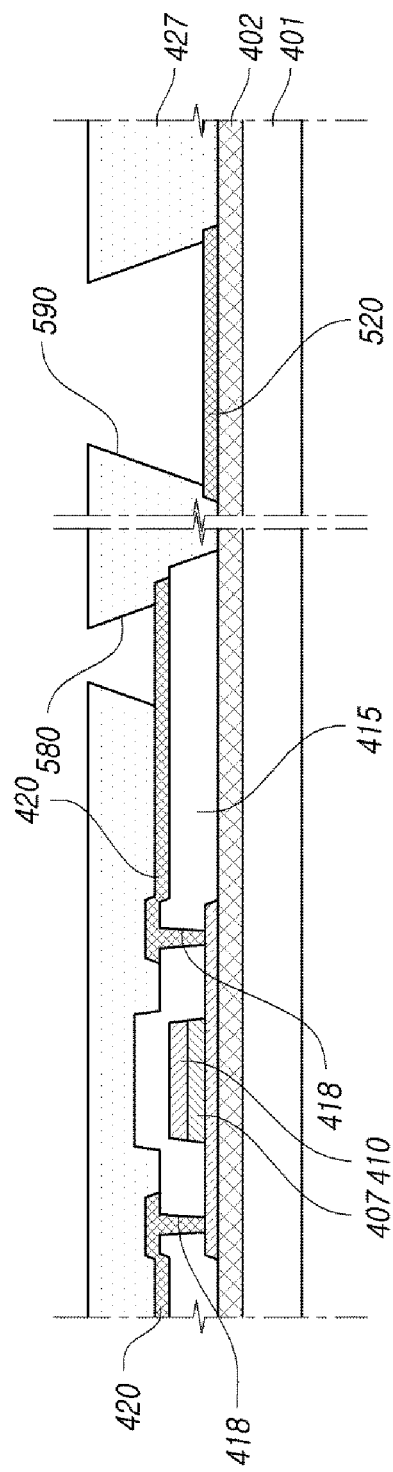
Figure 9:
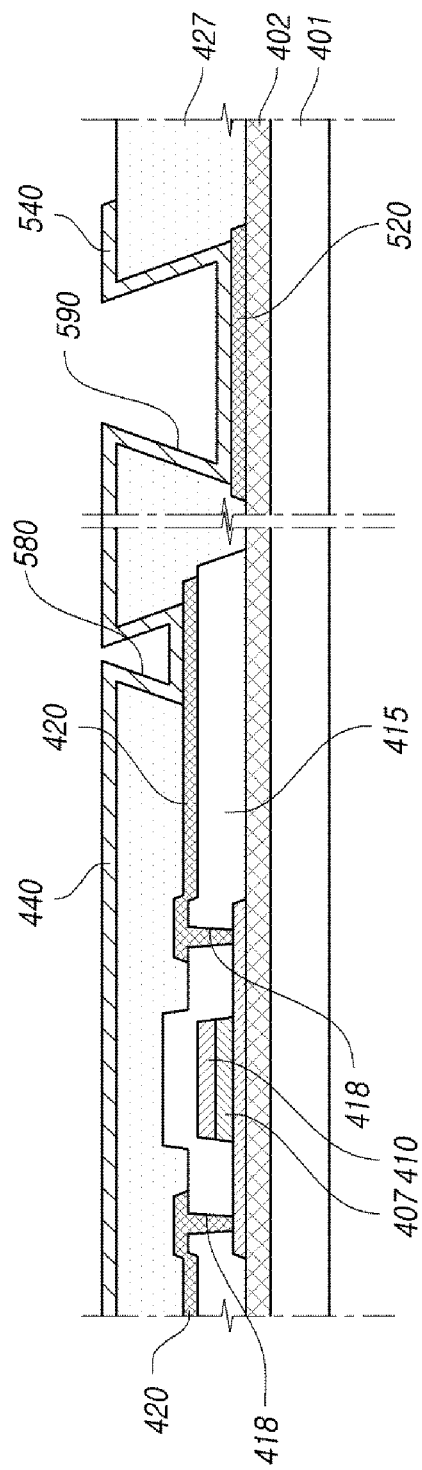

FIGS. 7 to 9 are sectional views illustrating the process of forming the panel structure of FIG. 5 according to an embodiment of the present invention.

Referring to FIG. 7, the buffer 402 is positioned on the substrate 401, and the active layer 405, the gate insulator 407, the gate 410, the interlayer dialect 415, the source and drain 420, and the first pacification layer 427 are formed on the buffer. In addition, the second auxiliary line 520 is formed of the same material as the source and drain 420 by the same mask. The negative PR may be used as an example of the first pacification layer 427.

FIG. 8 shows that the negative PR of FIG. 7 is etched to form the contact hole 580 to allow a part of the source/drain 420 to come into contact with the anode 440, and the contact hole 590 for the partial contact of the second auxiliary line 520. The negative PR is etched to have an inversely tapered form.

FIG. 9 shows that the anode 440 is formed to come into contact with the source/drain 420 through the contact hole 580 of FIG. 8, and the first auxiliary line 540 is formed to come into contact with the second auxiliary line 520 as well.

Next, the bank 450, the organic light-emitting layer 470, and the cathode 480 are formed, and the cathode 480 may come into contact with the first auxiliary line 540.

FIGS. 10 to 13 are plan views related to the sectional views of FIGS. 7 to 9.

Figure 10:
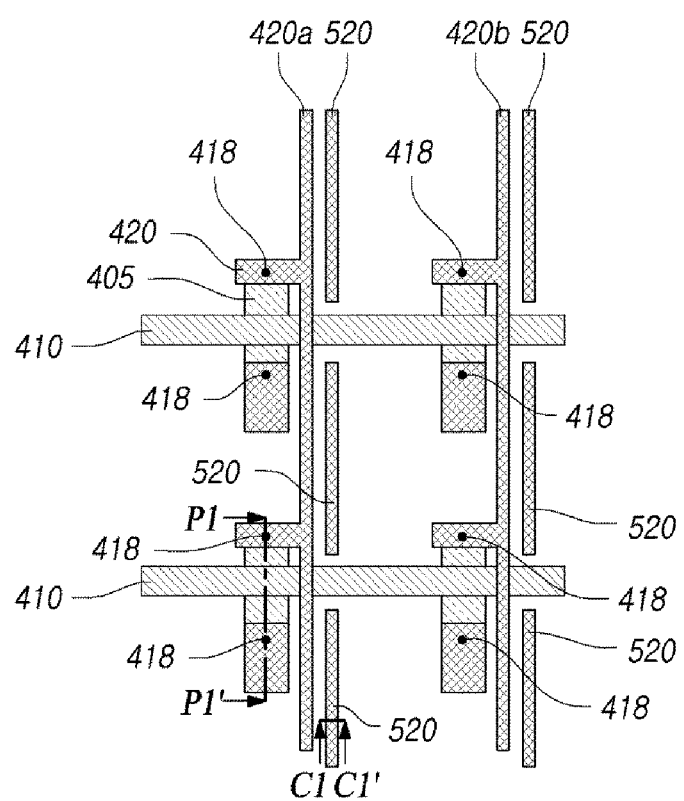
FIGS. 10 to 13 are plan views related to the sectional views of FIGS. 7 to 9.

FIG. 10 is a plan view showing the structure before the first pacification layer 427 is formed in the section of FIG. 7. The data lines 420*a* and 420*b*, the source/drain 420 that comes into contact with the same, and the second auxiliary line 520 of the same material are formed. When the second auxiliary line 520 is not formed on the interlayer dialectric 415, it may have discontinuities in the vertical direction as shown in FIG. 10. When the interlayer dialect 415 (not shown in FIG. 10) is positioned under the second auxiliary line 520, the second auxiliary line 520 may have a continuous structure in the vertical direction. In the case where the step for preventing the deposition of the organic material constituting the organic light-emitting layer can be secured in another area, the interlayer dialect 415 may be positioned under the second auxiliary line 520. Otherwise, the interlayer dialect 415 is not formed under the second auxiliary line 520 to secure the step, and to thereby facilitate the deposition of the first auxiliary line 540 and the deposition of the cathode 480 by the step coverage.

Figure 11:
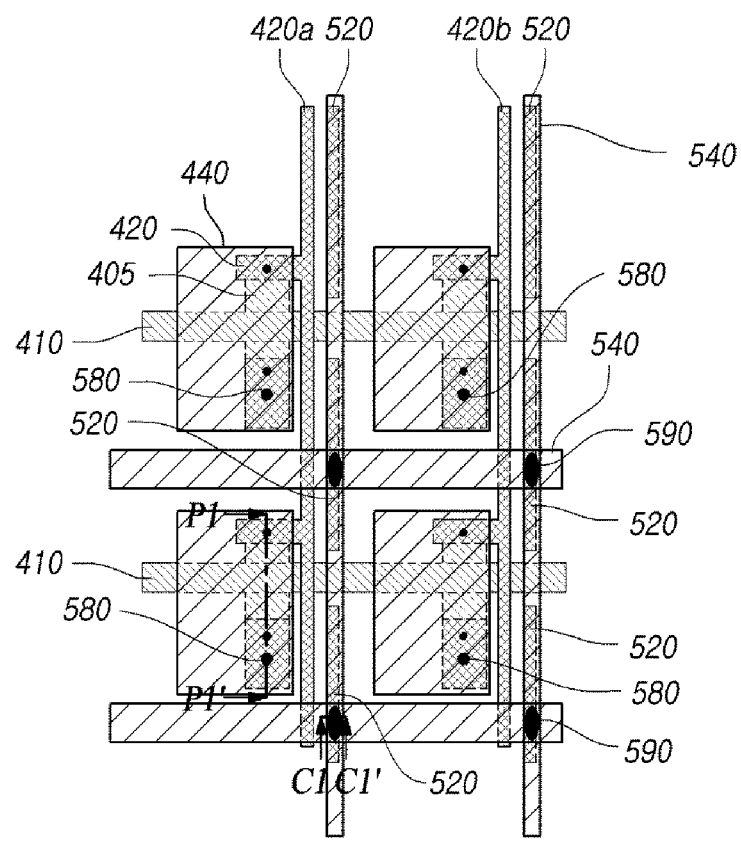

FIG. 11 is a plan view corresponding to the sectional view of FIG. 9. The anode 440 comes into contact with the source/drain 420 through the contact hole 580. In addition, the first auxiliary line 540 is formed of the same material as the anode 440 in the same process. The first auxiliary line 540 may be formed in the form of a lattice (or grid or matrix having row and columns) in both the vertical direction and the horizontal direction. In another embodiment, the first auxiliary line 540 may be formed in one of either the vertical direction or the horizontal direction. In another embodiment of the present invention, the first auxiliary line 540 may be formed in one of either the horizontal direction or the vertical direction.

The contact hole 590 of FIG. 11 (as well as the contact hole 690 from the embodiment illustrated in FIG. 6) may be extended in the vertical direction or in the horizontal direction. That is, the whole of the first auxiliary line 540 may be configured to include the step similar to the contact hole 580, and the size and the position of the contact hole 590 may vary according to the properties of the display panel. That is, if the contact portion between the first auxiliary line 540 and the cathode increases, the contact hole 590 may be variously formed or etched in the boundary of the first auxiliary line 540.

Figure 12:
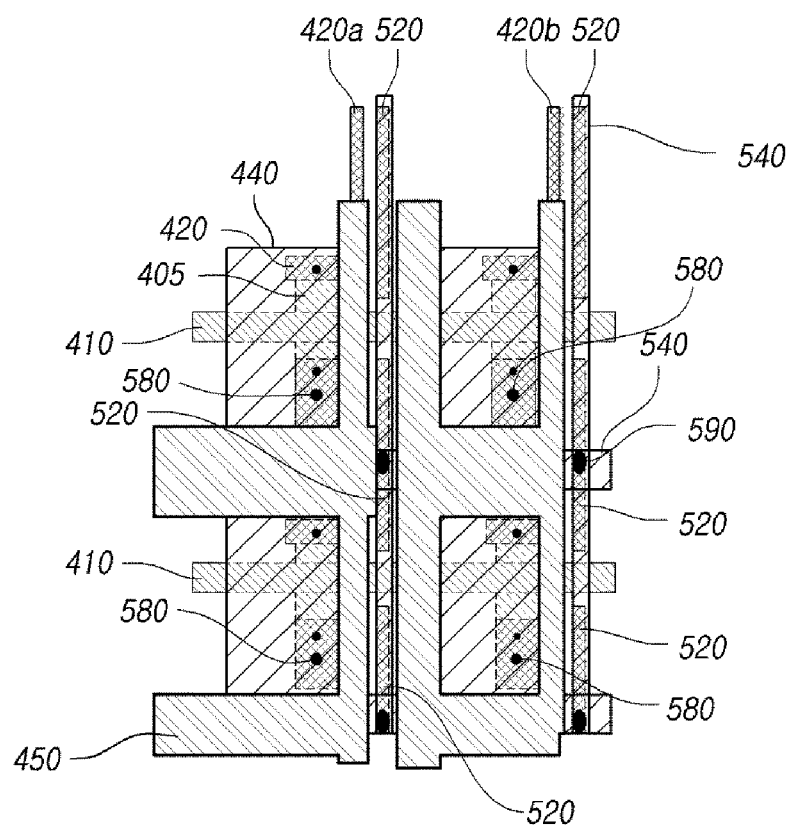

FIG. 12 is a plan view in which the bank is formed in FIG. 11. The bank 450 may be formed such that the first auxiliary line 540 is exposed in part (This is also applicable to first auxiliary line 640 from the embodiment illustrated in FIG. 6). The area of the first auxiliary line 540, which is not covered by the bank 450, may come into contact with the cathode in order to prevent the voltage drop of the cathode.

Figure 13:
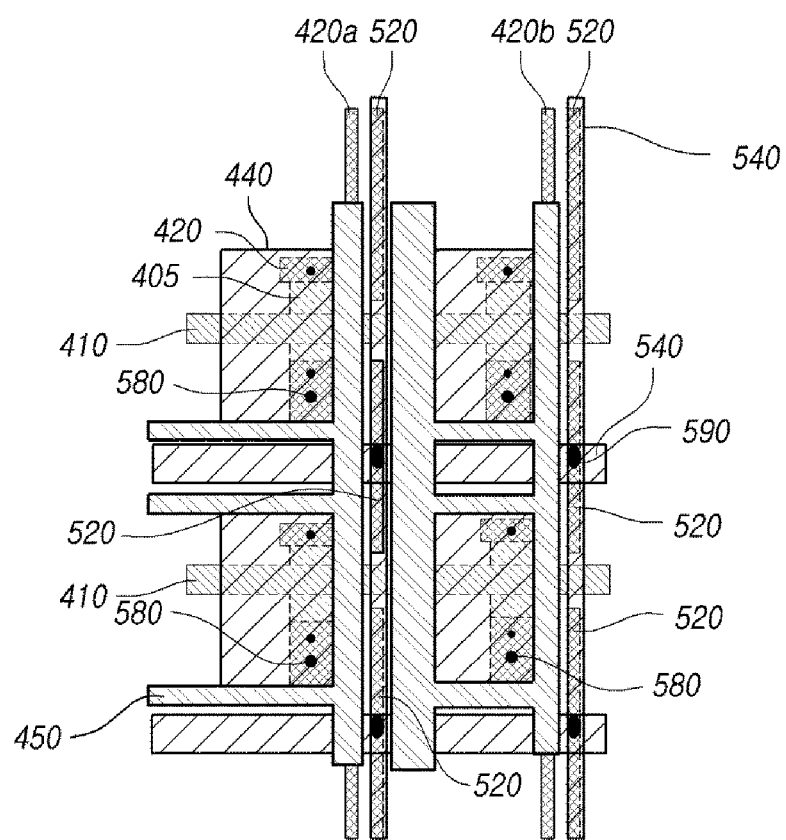

FIG. 13 is another plan view in which the bank is formed in FIG. 11. The embodiments of FIGS. 5 and 6 illustrate example implementations where the bank 450 at least partially covers the first auxiliary line 540/640, such as the portion on the top surface of the top-most pacification layer (427 and 435 in FIGS. 5 and 6 respectively). However, in other embodiments, the bank 450 may be formed such that the whole of the first auxiliary line 540 is exposed. The area of the first auxiliary line 540 that is not covered by the bank 450, may come into contact with the cathode to prevent the voltage drop of the cathode.

Figure 14:
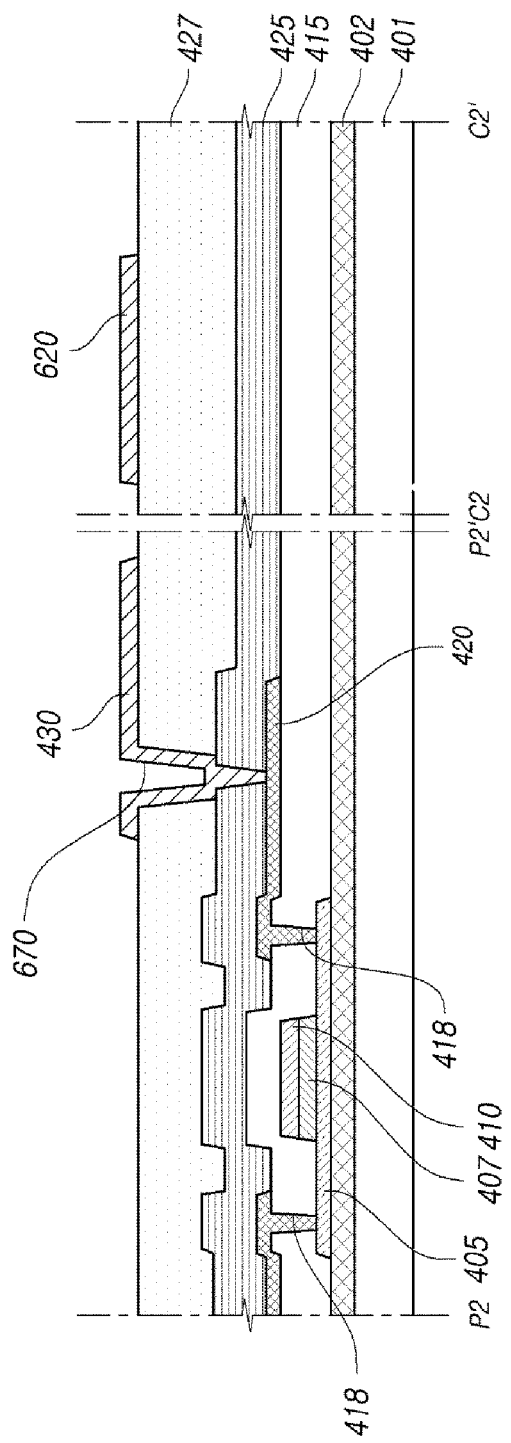
FIGS. 14 and 15 are sectional views illustrating the process of forming the panel structure of FIG. 6 according to an embodiment of the present invention.
Figure 15:
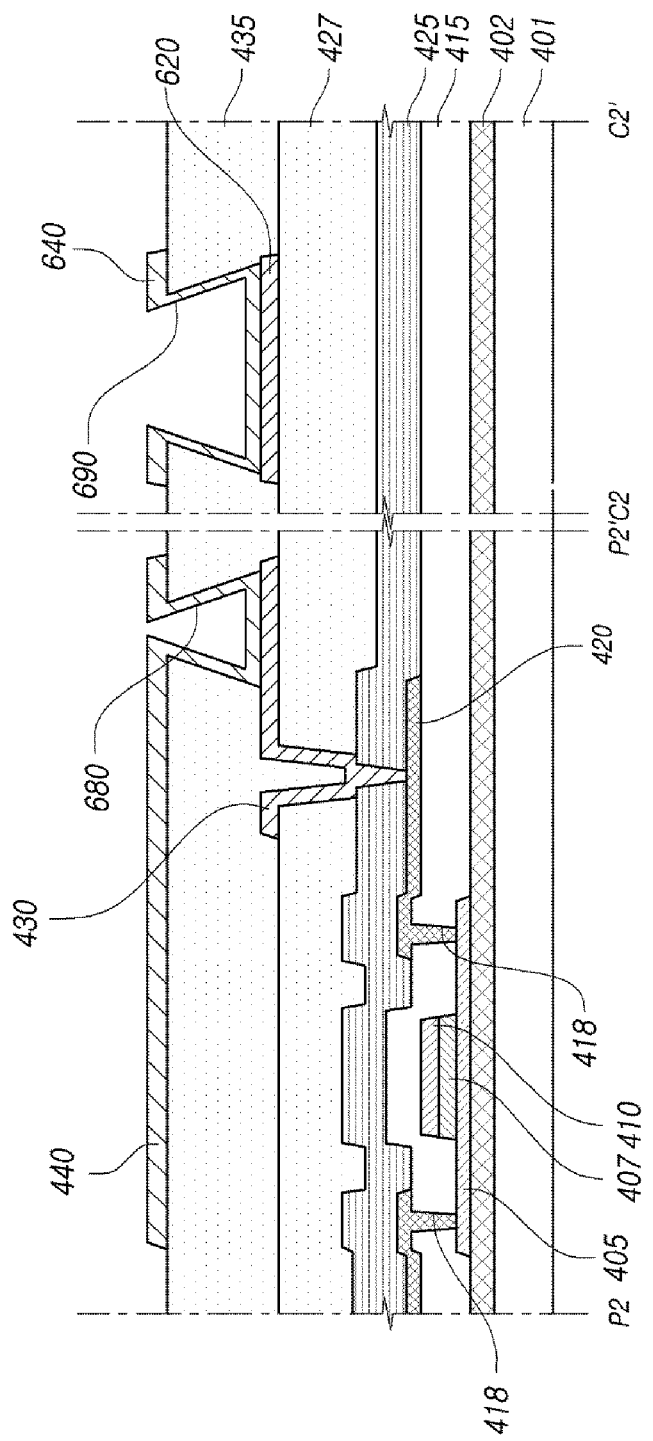

FIGS. 14 and 15 are sectional views illustrating the process of forming the panel structure of FIG. 6 according to an embodiment of the present invention.

Referring to FIG. 14, the buffer 402 is positioned on the substrate 401, and the active layer 405, the gate insulator 407, the gate 410, the interlayer dialect 415, the source and drain 420, the passivation layer 425, and the first pacification layer 427 are formed in sequence on the buffer. The connection electrode 430 comes into contact with the source and drain 420 through the contact hole 670, and the second auxiliary line 620 is formed of the same material as the connection electrode 430.

FIG. 15 is a sectional view showing the second pacification layer 435, and the anode 440 and the first auxiliary line 640 formed thereon. The negative PR may be coated as an example of the second pacification layer 435. Two contact holes 680 and 690 of the second pacification layer 435 are formed in an inversely tapered form, and the anode 440 and the first auxiliary line 640 are formed on the wall of the contact holes 680 and 690. Next, the bank 450, the organic light-emitting layer 470, and the cathode 480 are formed so that the cathode 480 comes into contact with the first auxiliary line 640.

Figure 16:
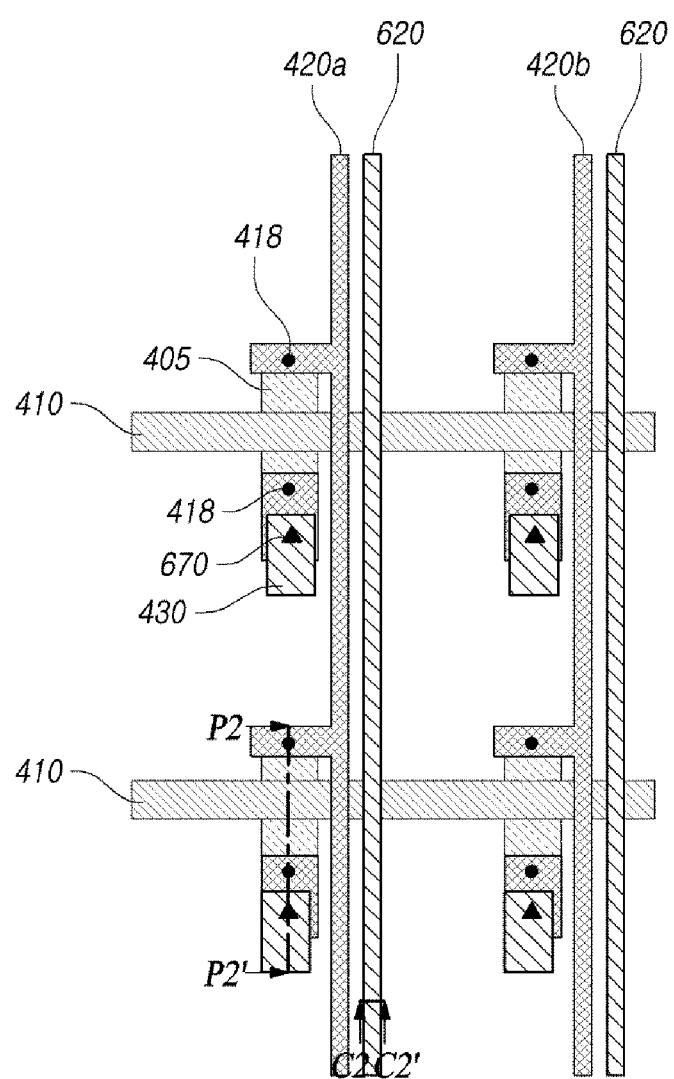
FIGS. 16 and 17 are plan views related to the sectional views of FIGS. 14 to 15.
Figure 17:
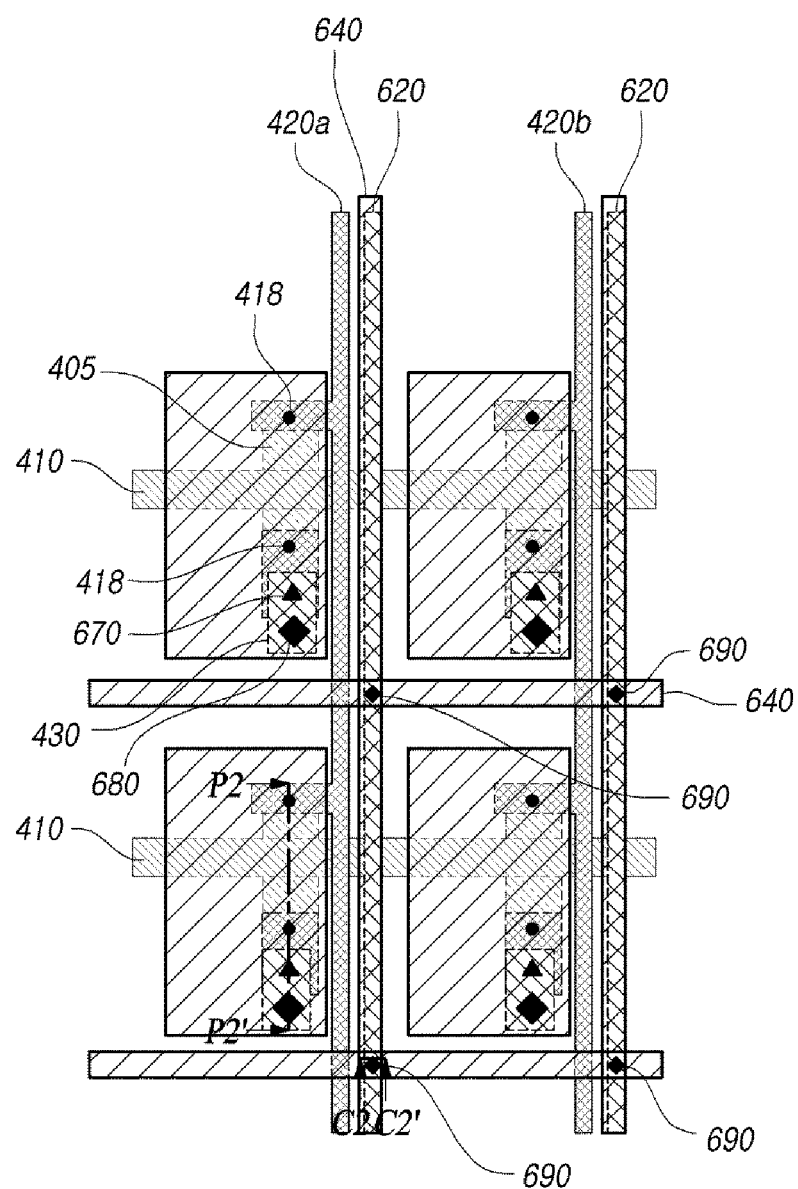

FIGS. 16 and 17 are plan views related to the sectional views of FIGS. 14 to 15.

FIG. 16 is a plan view showing the configuration of the lines except for the interlayer dialect 415, the passivation layer 425, and the first pacification layer 427, which correspond to the protective layer, of FIG. 14.

Referring to FIG. 17, as shown in the section of FIG. 15, the anode 440 (shown in FIG. 15 but not FIG. 17) and the first auxiliary line 640 are formed. The anode 440 comes into contact with the connection electrode 430 through the contact hole 680, and the first auxiliary line 640 comes into contact with the second auxiliary line 620 through the contact hole 690. Afterwards, the bank 450 (shown in FIG. 6, not shown in FIG. 17) is formed such that the first auxiliary line 640 comes into contact with the cathode as shown in FIG. 12 and FIG. 13.

As described in FIG. 11 above, the contact hole 690 of FIG. 17 may be extended in the vertical direction or in the horizontal direction. That is, the whole of the first auxiliary line 640 may be configured to include the steps similar to the contact hole 690, and the size and the position of the contact hole 690 may vary according to the properties of the display panel. That is, if the contact portion between the first auxiliary line 640 and the cathode increases, the contact hole 690 may be variously formed or etched in the boundary of the first auxiliary line 640.

In the case of applying the present invention, the wall of the contact hole 590 or 690, where the first auxiliary line 540 or 640 is deposited, is shaped into an inversely tapered form. In an embodiment, when the protective layer, in which the contact hole 590 or 690 is formed, for example, the pacification layers 427 and 435 are formed using the negative PR, the contact holes 590 and 690 are formed in the inversely tapered form, and the organic material (EL) does not permeate into the walls to thereby enable the contact of the cathode and the first auxiliary line 540 or 640. The permeation of the organic material into the contact hole may be prevented by the step that is as high as the bank 450 and the pacification layer 427.

That is, even though the organic material is deposited without a mask, the organic material is not deposited on the wall of the first auxiliary line 540 or 640 to thereby increase the electrical contact area between the cathode and the first auxiliary line 540 or 640. Meanwhile, when the organic layer is deposited without a mask or when the organic layer is deposited without separating the auxiliary line area, the organic light-emitting layer may be formed under the contact hole 590 or 690. According to this, in forming the auxiliary line in the present invention, the mask is not added when depositing the organic material to thereby increase the efficiency of the process.

In forming the auxiliary lines in the form of a mesh on the display panel as described above, the auxiliary lines may be formed in one direction, or preferably, in two directions (e.g., the vertical direction and the horizontal direction) to come into contact with the cathode.

Figure 18:
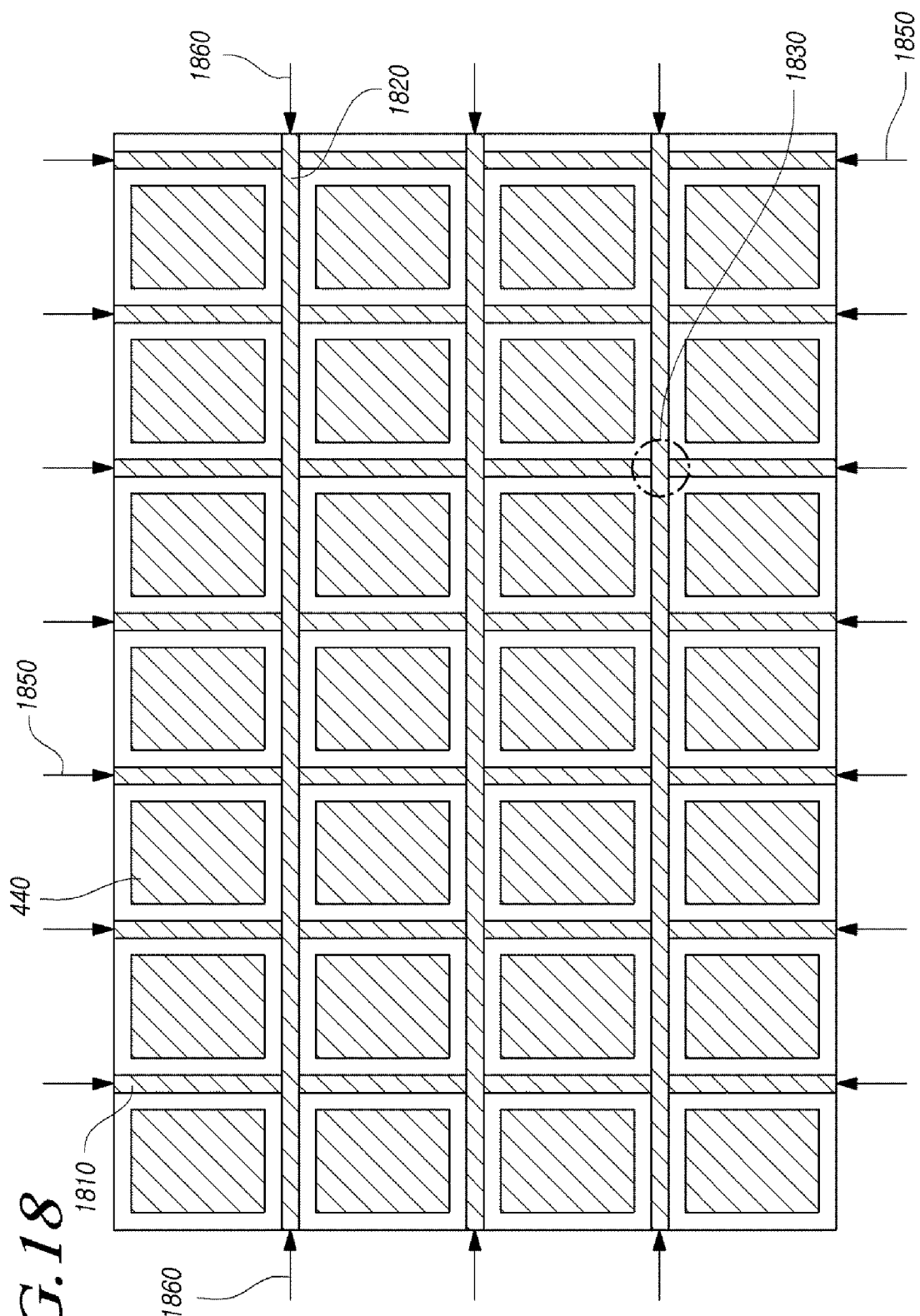
FIG. 18 is a view showing the positions of auxiliary lines with respect to pixel areas and an anode in the panel in applying an embodiment of the present invention thereto.

FIG. 18 is a view showing auxiliary lines with respect to the pixel areas and the anode in the panel, to which the present invention is applied. The anode 440 and the auxiliary lines 1810 and 1820 are positioned in the pixel area. The auxiliary lines 1810 and 1920 are arranged to form a grid of lines. Vertical lines 1810 pass along a first axis and are mostly if not entirely parallel to each other and are also mostly if not entirely parallel to the plane of the display surface. Horizontal lines 1820 pass along a second axis and are mostly if not entirely perpendicular to the first axis and are also mostly if not entirely parallel to the plane of the display surface.

Lines 1810 and 1820 may be placed between each row or column of subpixels or pixels, between every two rows or columns subpixels, between every row and every other column of subpixels, vice versa, or any other combination of arrangements including between every fifth row and third column, etc. Greater distance between lines represents a tradeoff, as the greater the distance between lines, the greater the resistance in the cathode at pixels located distant from one of the lines.

Under the vertical auxiliary line 1810 of the auxiliary lines, another (second) auxiliary line (see 520 in the embodiment of FIG. 5) formed of the same material as the source or the drain electrode may be positioned, or another auxiliary line (see 620 in the embodiment of FIG. 6) formed of the same material as the connection electrode (see 430 in the embodiment of FIG. 6) may be positioned. In addition, the auxiliary lines, which overlap each other, may come into contact with each other through the contact hole in the intersection area 1830.

In addition, in FIG. 18, one end or both ends of the auxiliary lines 1810 and 1820 may be applied with the same power (the base power) and/or the same voltage and current as the cathode, i.e., the second electrode, so that the base power/voltage/current can be more uniformly applied throughout the display panel. Therefore, the brightness is uniform in both the edges and the center of the display panel.

Although the auxiliary lines 1810 and 1820 are positioned between the pixel areas in FIG. 18, the auxiliary lines may be variously formed in consideration of the aperture-ratio.

Figure 19:
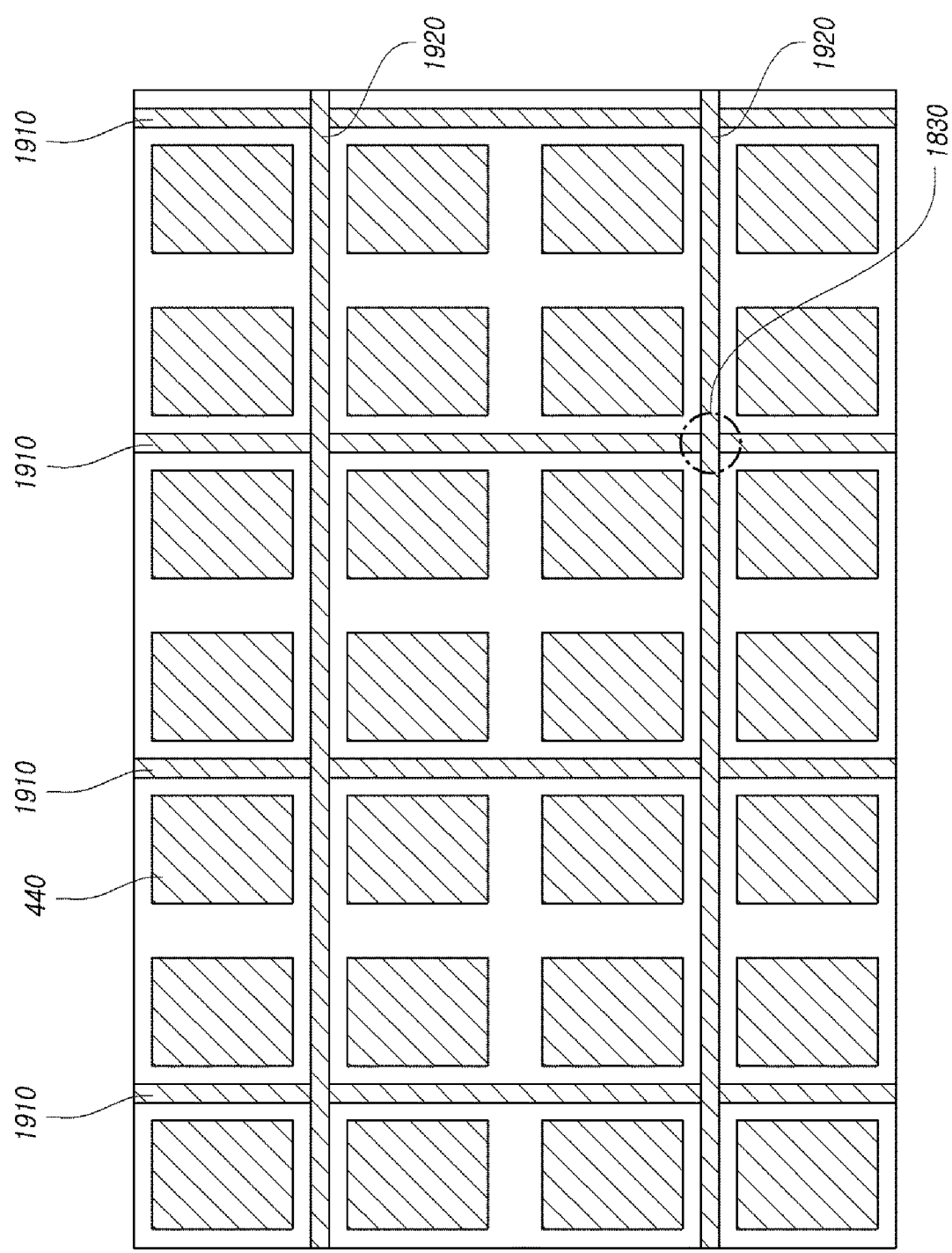
FIG. 19 is a view showing the positions of auxiliary lines with respect to pixel areas and an anode in the panel in applying another embodiment of the present invention thereto.

FIG. 19 shows the embodiment in which the auxiliary lines 1910 and 1920 are formed in a part of the non-aperture area between the pixel areas, unlike FIG. 18. This may be variously applied in consideration of the size of the display panel and the aperture-ratio thereof. That is, the whole of the non-aperture area between the pixel areas is not configured as the contact area, whereas a part thereof may be configured as the contact area where the auxiliary lines 1910 and 1920 are formed.

Figure 20:
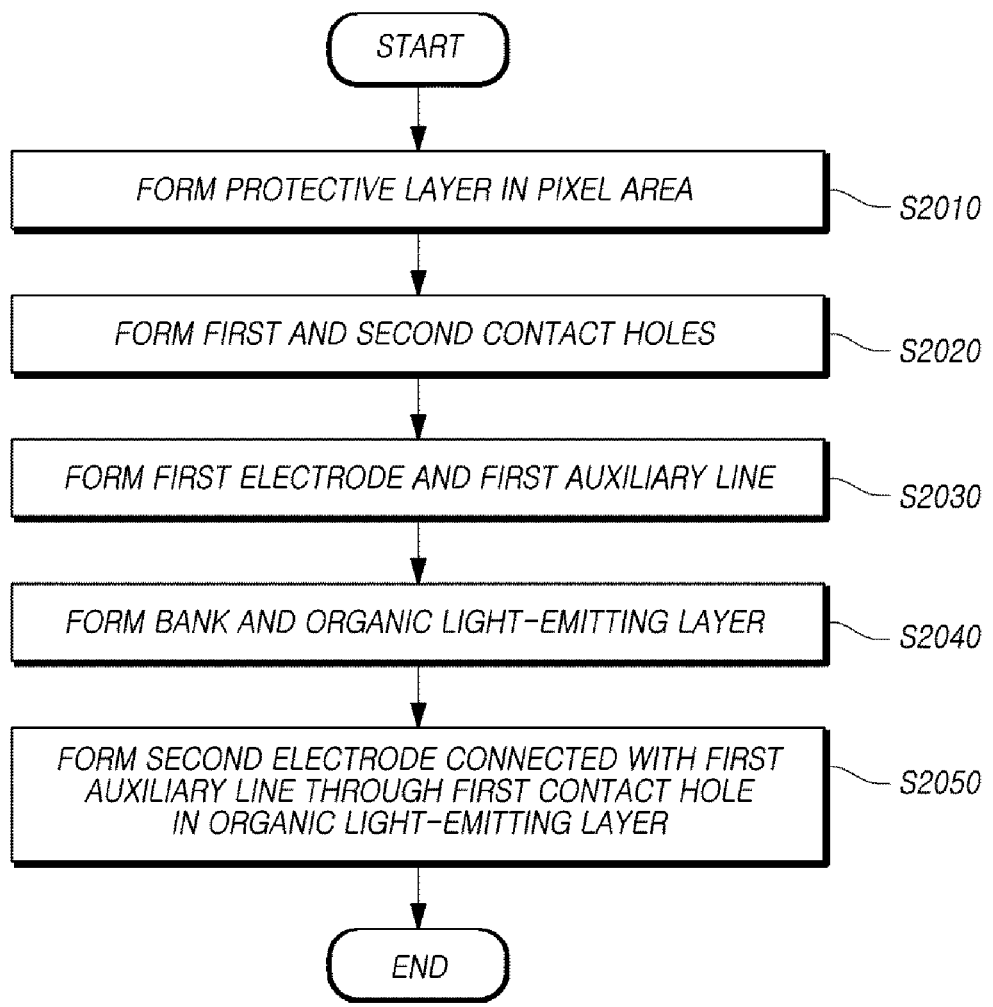
FIG. 20 is a flowchart illustrating the process of implementing the embodiments of the present invention mentioned above.

FIG. 20 is a flowchart illustrating the process of implementing the embodiments above in the present invention. A plurality of pixel areas is formed on the substrate, and the protective layer is formed on the pixel areas (S2010). This corresponds to the operation of forming the pacification layer (see 435 of FIGS. 5, and 427 of FIG. 6) on which the anode 440 is to be positioned in FIGS. 5 and 6 above. In the protective layer, the first contact hole 590 or 690 where the first auxiliary line is positioned, and the second contact hole 580, which exposes a part of the source or the drain 420 of the thin film transistor positioned in the pixel area, or the second contact hole 680, which exposes the connection electrode connected with the source or the drain 420 are formed (S2020). Next, the first electrode 440 is formed such that the first electrode 440 is deposited on the wall of the contact hole 580 or 680, and the first auxiliary line 540 or 640 is formed such that the first auxiliary line 580 or 680 is deposited on the wall of the first contact hole 590 or 690 (S2030).

Afterwards, the bank, which defines the pixel area and exposes the first contact hole 590 or 690, is formed, and then, the organic light-emitting layer is formed (S2040). In forming the organic light-emitting layer, the organic light-emitting layer is not deposited on the wall of the first contact hole 590 or 690 due to the bank 450 and the step of the first contact hole 590 or 690. Exceptionally, the organic light-emitting layer may be deposited on the bottom surface of the first contact hole 590 or 690. Afterwards, the second electrode, which comes into contact with the first auxiliary line 540 or 640 through the first contact hole 590 or 690, is formed on the organic light-emitting layer (S2050).

The structure of FIG. 5 may further include the operation of forming the second auxiliary line 520 prior to the operation S2010. For example, the source or the drain 420, and the second auxiliary line 520 may be formed before the operation 52010, and the second auxiliary line 520 may be exposed in the first contact hole 590. The structure of FIG. 5 may reduce the protective layer so that the process efficiency can be enhanced.

The structure of FIG. 6 may further include the operation of forming the second auxiliary line 620 prior to the operation S2010. For example, the third contact hole 670, which exposes a part of the source or the drain 420, may be formed before the operation S2010, and the connection electrode, which is connected with the source or the drain 420 through the third contact hole 670, and the second auxiliary line 620 may be formed. After that, the second auxiliary line 620 may be exposed through the first contact hole 690. At this time, the second auxiliary line 620 may be thickly formed. That is, since the second auxiliary line 620 is formed independently from the source/drain 420, the second auxiliary line 620 may be thickly deposited in the process. Consequently, the resistance of the cathode 480 may be reduced by increasing the thickness of the second auxiliary line 620.

The present invention may be applied to the development of a structure by which the uniformity of the brightness can be enhanced in the large-scale display panel, particularly, in the organic light emitting diode (OLED) in the top-emission type.

When the processes of FIG. 20 are applied, the first auxiliary line is positioned between the pixel areas, and the first auxiliary line is formed of the same material as the first electrode, i.e., the anode, in the same process, so the number of processes can be reduced. In addition, since it is not required to form a separate layer for the first auxiliary line, it is possible to make a thin film display panel. Furthermore, the second electrodes, i.e., cathodes, are uniformly provided in the display panel through the first auxiliary lines so that the brightness of the display panel can be uniform, and the visual sensibility thereof can be improved as well.

In general, a high cathode-resistance of the TE OLED causes the non-uniformity in the brightness, so in order to overcome the same, a low-resistance cathode is required. As shown in FIG. 3, in the case where the auxiliary line is interposed between the pacification layers, and the cathode comes into contact with the auxiliary line through the partition structure, the number of layers may increase. For example, layers, such as the second pacification layer, the auxiliary line, or the partition, may increase.

Meanwhile, in the present invention, the source/drain and the anode (or reflector) are used as the auxiliary lines, and the first pacification layer is formed as the partition structure by using the negative PR, so that the cathode comes into contact with the auxiliary line to thereby implement the low-resistance cathode. Since the organic material travels straight, but the metal has good step coverage due to the irregular directivity, in the deposition process, the metal can be deposited on the contact hole formed in the pacification layer, so that the auxiliary line comes into contact with the cathode. In addition, the auxiliary line may be formed in the vertical direction when the source/drain is formed, and additionally, the auxiliary lines may be formed in the form of a mesh when the anode is formed to thereby come into contact.

The above description and the accompanying drawings provide an example of the technical idea of the present invention for illustrative purposes only. Those having ordinary knowledge in the technical field, to which the present invention pertains, will appreciate that various modifications and changes in form, such as combination, separation, substitution, and change of a configuration, are possible without departing from the essential features of the present invention. Accordingly, the embodiments disclosed in the present invention are merely to not limit but describe the technical spirit of the present invention. Further, the scope of the technical spirit of the present invention is limited by the embodiments. The scope of the present invention shall be construed on the basis of the accompanying claims in such a manner that all of the technical ideas included within the scope equivalent to the claims belong to the present invention.

What is claimed is:

1. A display device comprising:
   a pixel area comprising:
      a pacification layer;
      an anode electrically coupled to a source or a drain of a thin film transistor though the pacification layer;
      an organic light-emitting layer formed on the anode;
      a cathode formed on the organic light-emitting layer; and
   a contact area comprising:
      an auxiliary contact hole formed in the pacification layer, the auxiliary contact hole having an inverse tapered shape;
      an auxiliary line having a first portion formed over the pacification layer and a second portion formed in the auxiliary contact hole as an inverse tapered shape;
      a portion of the cathode physically contacting the second portion of the auxiliary line within the auxiliary contact hole.

2. The display device of claim 1 further comprising:
   a bank layer formed on both the pacification layer and the first portion of the auxiliary line.

3. The display device of claim 1 further comprising:
   a bank layer formed on the pacification layer but leaving exposed the first portion of the auxiliary line.

4. The display device of claim 1 wherein the inverse tapered shape of the auxiliary contact hole is such that an upper portion of the auxiliary contact hole is narrower than a bottom portion of the auxiliary contact hole.

5. The display device of claim 1
   wherein the second portion of the auxiliary line is formed against a plurality of sidewalls of the auxiliary contact hole; and
   wherein the portion of the cathode physically contacts the second portion of the auxiliary line formed against the sidewalls.

6. The display device of claim 1 further comprising:
   an island of bank material formed on the second portion of the auxiliary line formed on a bottom of the auxiliary contact hole, the island of bank material located beneath some portion of the cathode.

7. The display device of claim 1
   wherein the auxiliary contact hole is extended to have a greater length or width in a horizontal or a vertical direction, respectively, along a direction parallel to a surface of the display device.

8. The display device of claim 1 further comprising:
   an anode contact hole formed in the pacification layer, the anode contact hole having an inverse tapered shape.

9. The display device of claim 8 wherein the anode is formed against a plurality of sidewalls of the anode contact hole.

10. The display device of claim 1 wherein the auxiliary line is a first auxiliary line and wherein the display device further comprises:
    a second auxiliary line formed beneath the first auxiliary line and electrically coupled to the first auxiliary line.

11. The display device of claim 10
    wherein the second auxiliary line has a thickness greater than the source or drain of the thin film transistor.

12. The display device of claim 1
    wherein the pacification layer comprises a first thickness in the contact area and a second thickness in the pixel area; and
    wherein the first thickness is thicker than the second thickness.

13. The display device of claim 1 wherein the pacification layer is a first pacification layer, and wherein the auxiliary line is a first auxiliary line.

14. The display device of claim 1 wherein the pacification layer is a second pacification layer, and wherein the auxiliary line is a first auxiliary line, the display device further comprising:
    a first pacification layer formed beneath the second pacification layer.

15. The display device of claim 14 further comprising
    a connection electrode electrically coupled to a source or a drain of a thin film transistor through the first pacification layer;
    an anode electrically coupled to the connection electrode though the second pacification layer.

16. The display device of claim 15
    a second auxiliary line formed on the first pacification layer and electrically coupled to the first auxiliary line, the second auxiliary electrode having a thickness greater than the connection electrode.

17. The display device of claim 1
    wherein the pixel area is plural,
       a plurality of the pixel areas are aligned in grid pattern across a surface,
       each anode is electrically isolated from each other anode,
       the cathode is electrically common, and the auxiliary line comprises a horizontal set of first auxiliary lines and a vertical set of first auxiliary lines wherein the horizontal set of the first auxiliary lines traversing the pixel areas along a first axis, each of the first auxiliary lines of the horizontal set passing between two rows of the pixel areas, the vertical set of the first auxiliary lines traversing the pixel areas along a second axis, each of the first auxiliary lines of the vertical set passing between two columns of the pixel areas; and each of the first auxiliary lines is electrically coupled to a portion of the cathode located proximately to one of the pixel areas.

18. The display device of claim 17 wherein for at least a subset of the pixel areas, one of the auxiliary lines is located on at least one side of each pixel area in the subset.

19. The display device of claim 18 wherein for the subset of pixel areas, one of the auxiliary lines is located on each side of each pixel area in the subset.

20. The display device of claim 17
wherein a plurality of the auxiliary contact holes is located at a plurality of intersection points between the horizontal and the vertical sets of first auxiliary lines and the horizontal and the vertical sets of first auxiliary lines are electrically coupled through the contact holes.

21. The display device of claim 17 further comprising:
a horizontal set of second auxiliary lines formed underneath and electrically connected to the horizontal set of the first auxiliary lines; and
a vertical set of second auxiliary lines formed underneath and electrically connected to the vertical set of the first auxiliary lines.

22. The display device of claim 21 wherein the second auxiliary lines are formed of a same material as a source, a drain, or a connection electrode of each of the pixel areas.

23. The display device of claim 21 wherein the second auxiliary lines comprise a plurality of discontinuities, leaving gaps in the second auxiliary lines between each pixel area.

24. The display device of claim 21 further comprising:
an interlayer dielectric formed under and physically contacting the second auxiliary lines.

* * * * *